United States Patent

Murashita et al.

[11] Patent Number: 5,844,508
[45] Date of Patent: Dec. 1, 1998

[54] DATA CODING METHOD, DATA DECODING METHOD, DATA COMPRESSION APPARATUS, AND DATA DECOMPRESSION APPARATUS

[75] Inventors: Kimitaka Murashita; Yoshiyuki Okada; Shigeru Yoshida, all of Kanagawa, Japan

[73] Assignee: Fujitsu Limited, Kawasaki, Japan

[21] Appl. No.: 732,054

[22] Filed: Oct. 17, 1996

[30] Foreign Application Priority Data

Dec. 1, 1995 [JP] Japan .................................. 7-314525

[51] Int. Cl.⁶ ...................................................... H03M 7/34
[52] U.S. Cl. ................................ 341/51; 341/59; 341/65; 341/63; 341/87
[58] Field of Search .................................. 341/51, 59, 63, 341/87, 65

[56] References Cited

U.S. PATENT DOCUMENTS

| | | | |
|---|---|---|---|
| 3,553,362 | 1/1971 | Mounts | 178/7.1 |
| 4,028,731 | 6/1977 | Arps et al. | 358/260 |
| 4,257,069 | 3/1981 | Murayama et al. | 358/261 |
| 4,866,440 | 9/1989 | Tsukiyama et al. | 341/95 |
| 5,264,942 | 11/1993 | Shimotsuji et al. | 358/261.1 |
| 5,317,428 | 5/1994 | Osawa et al. | 358/539 |

FOREIGN PATENT DOCUMENTS 1216674  2/1988  Japan .

OTHER PUBLICATIONS

The New IEEE Standard Dictionary of Electrical and Electronics Terms, 5th Ed. C.J. Booth, Editor, ISBN 1–55937–240–0, p. 1158, Sep. 17, 1992.

*Primary Examiner*—Jeffrey A. Gaffin
*Assistant Examiner*—Jason L. W. Kost
*Attorney, Agent, or Firm*—Staas & Halsey

[57] ABSTRACT

A data compression and decompression apparatus and method providing a high compression ratio. The data compressing apparatus includes, for example, an obtaining section, a first coding section, a first controlling section, a judging section, a second coding section, and a second controlling section. Characters are obtained one after another from a compression target. A code is then output corresponding to the character when the character and a predetermined number of characters are not identical. Subsequently, the number of characters obtained are counted when the character and the predetermined number of characters are identical, and a code corresponding to the number of characters counted is output when the character obtained is not identical with the predetermined number of characters.

17 Claims, 21 Drawing Sheets

FIG. 7

| CATEGORY | RUN-LENGTH L. |
|---|---|
| 0 | 0, 1, 2, 3, 4, 5, 6, 7 |
| 1 | 8, 9, 10, 11, 12, 13, 14, 15 |
| 2 | 16, 17, 18, 19, 20, 21, 22, 23 |
| ⋮ | |
| n | 8*n, ··············· , 8*n+7 |
| ⋮ | |

WHEN RUN-LENGTH L = 72868,

RUN-LENGTH L: 72868 = 65535 + 7333

CODE DATA : CATEGORY + CATEGORY + POSITIONAL INFORMATION (BINARY EXPRESSION) "1 0"  "1 1 1 1 1 1 0 0" + "1 1 0 0 1 0 1 0 0 1 1 0"

(HEXADECIMAL EXPRESSION) "2 f c c a 6"  CODE LENGTH : 2 2 BIT (2 + 8 + 1 2)

| CATEGORY | RUN-LENGTH L | CODE LENGTH | CODE EXAMPLES (BINARY) | LENGTH OF POSITIONAL INFORMATION | TOTAL CODE LENGTH |
|---|---|---|---|---|---|
| 0 | 0 | 1 | 0 | 0 | 1 |
| 1 | 1, 2 | 4 | 1 1 0 0 | 1 | 5 |
| 2 | 3, 4, 5, 6 | 4 | 1 1 0 1 | 2 | 6 |
| 3 | 7, ···, 1 4 | 7 | 1 1 1 1 0 0 0 | 3 | 10 |
| 4 | 1 5, ···, 3 0 | 8 | 1 1 1 1 0 1 0 0 | 4 | 12 |
| 5 | 3 1, ···, 6 2 | 8 | 1 1 1 1 0 1 0 1 | 5 | 13 |
| 6 | 6 3, ···, 126 | 8 | 1 1 1 1 0 1 1 0 | 6 | 14 |
| 7 | 127, ···, 254 | 8 | 1 1 1 1 0 1 1 1 | 7 | 15 |
| 8 | 255, ···, 510 | 8 | 1 1 1 1 1 0 0 0 | 8 | 16 |
| 9 | 511, ···, 1022 | 8 | 1 1 1 1 1 0 0 1 | 9 | 17 |
| 1 0 | 1023, ···, 2046 | 8 | 1 1 1 1 1 0 1 0 | 10 | 18 |
| 1 1 | 2047, ···, 4094 | 8 | 1 1 1 1 1 0 1 1 | 11 | 19 |
| 1 2 | 4095, ···, 8190 | 8 | 1 1 1 1 1 1 0 0 | 12 | 20 |
| 1 3 | 8191, ···, 16382 | 8 | 1 1 1 1 1 1 0 1 | 13 | 21 |
| 1 4 | 16383, ···, 32766 | 7 | 1 1 1 1 0 0 1 | 14 | 21 |
| 1 5 | 32767, ···, 65534 | 4 | 1 1 1 0 | 15 | 19 |
| 1 6 | 6 5 5 3 5 | 2 | 1 0 | 0 | 2 |

FIG. 15

|  | 2bits | | 3bits | | | 4bits | |
|---|---|---|---|---|---|---|---|
| CHARACTER | a | b | c | d | e | f | g |
| FREQUENCY OF OCCURRENCE | 7 | 6 | 5 | 5 | 3 | 2 | 1 |
| PROBABILITY OF OCCURRENCE | 0.24 | 0.21 | 0.17 | 0.17 | 0.10 | 0.07 | 0.04 |
| CODEWORD | 00 | 10 | 010 | 011 | 110 | 1110 | 1111 |

```
        7    6    5    5    3    2    4   FREQUENCY
        a    b    c    d    e    f    g   CHARACTER
```

```
     2bits        3bits         4bits
   ┌───────┐  ┌───────────┐  ┌───────┐
   │ 7   6 │  │ 5   5   4 │  │ 3   2 │
   │ a   b │  │ c   d   g │  │ e   f │
   └───────┘  └───────────┘  └───────┘
```

| 25 | 6 | 5 | 5 | 3 | 2 | 4 | FREQUENCY |
| a | b | c | d | e | f | g | CHARACTER |

| 1bit | 3bits | | | 4bits | 5bits | |
|---|---|---|---|---|---|---|
| 25 | 6 | 5 | 5 | 4 | 3 | 2 |
| a | b | c | d | g | e | f |

| 1bit | 2bits | 4bits | | | 5bits | |
|---|---|---|---|---|---|---|
| 25 | 20 | 6 | 5 | 5 | 3 | 2 |
| a | g | b | c | d | e | f |

| 25 | 6 | 10 | 5 | 3 | 2 | 20 | FREQUENCY |
| a | b | c | d | e | f | g | CHARACTER |

DATA CODING METHOD, DATA DECODING METHOD, DATA COMPRESSION APPARATUS, AND DATA DECOMPRESSION APPARATUS

BACKGROUND OF THE INVENTION

1. Field of the Invention

The present invention relates to a data coding method, a data decoding method, a data compression apparatus, a data decompression apparatus, and a data compression/decompression system which are used, for instance, in storing or transmitting data in a computer.

2. Description of the Related Art

In recent years, various kinds of data such as character codes and image data are handled by a computer and the amount of data handled is increasing. Such a large amount of data can be compressed by omitting its redundant portions. By performing such data compression, it is possible to increase the apparent capacity of a disk or shorten the time necessary to transmit data to a distant location (by virtue of a reduced transmission data amount).

A compression scheme based on universal coding is known as being capable of compressing various kinds of data as mentioned above by a single scheme. A data compression scheme based on universal coding will be described below. Although the universal coding can be applied to any kind of data, the following description will be directed to an example of coding of character codes. In the following description, according to the information theory, one word unit of data is called "character" and a sequence of arbitrary characters is called "character string."

Universal coding schemes are generally classified into the following two types: a dictionary coding scheme which utilizes similarity of data sequences and a statistical coding scheme which utilizes frequencies of appearance of data sequences. The present invention relates to the latter, statistical coding scheme.

A typical example of the statistical coding scheme is a Huffman coding scheme. This scheme uses a code table (hereinafter referred to as "code tree") which is expressed by a tree structure consisting of "nodes" and "branches" that connect nodes.

The names of elements of a tree will be described below with reference to FIG. 13. First, a node that is located at the top of the tree is called "root." In the example of FIG. 14, node 1 is the root. A node (say "Y") that is located below a certain node (say "X") and connected thereto by a branch is called a "child of node X" and, conversely, node X is called a "parent of node Y." For example, nodes 8 and 9 are children of node 6, and node 3 is a parent of node 6. A parent of a parent, its parent, etc. are called "ancestors," and a child of a child, its child, etc. are called "descendants." For example, node 5 has node 1 as a single ancestor, and node 3 has nodes 8 and 9 as descendants. Further, two nodes having a certain node as a common parent are called "brothers." A node having no child is called "leaf." A node that is not a leaf is called "internal node." In this type of code tree, a character is allocated to each leaf of the tree. Since each branch necessarily branches off at a node into two branches, the latter two branches are respectively given codes "0" and "1." Therefore, there is one-to-one correspondence between a character that is allocated to each leaf and a sequence of codes that are given to the respective nodes located on a path from the root to that leaf. Thus, in coding a certain character, it can be uniquely converted into a code represented by a particular binary number by tracing a path (i.e., branches) from the root to the leaf corresponding to the character concerned.

The principle of Huffman coding to generate the above type of code tree will be described below with reference to FIG. 14. In the Huffman coding, first, leaves corresponding to respective characters (hereinafter referred to as "symbols") that have occurred and a probability or frequency of occurrence of each symbol is written in the associated leaf. The leaves are arranged in such an order that the frequency (probability) of occurrence increases from right to left.

Then, a new parent node is generated which have, as children, two leaves having the lowest probabilities (frequencies) of occurrence. The sum of the probabilities of occurrence of the two leaves (children) is written in the new node (parent). The new node (parent) and the two leaves (children) are connected together by two branches, of which the right-hand branch is given a value "1" and the left-hand branch is given a value "0."

Next, the new node and the remaining leaves are compared, and two of those having the lowest probabilities of occurrence are selected. A new parent node having the selected two node/leaves as children is generated. The new parent node and the two children are connected together by two branches. The above operation is repeated until a root is generated and the whole structure constitutes a single tree. In a code tree finally obtained, a path from the root to a leaf constitutes a codeword corresponding to that leaf. Since each branch is given a code "0" or "1" as described above, leftward branching at each branching point is assigned "0" and rightward branching is assigned "1," thus constituting a series of codes, i.e., a codeword. FIG. 15 is a table showing a relationship between symbols and codewords which is obtained by generating the code tree of FIG. 14.

The above Huffman coding scheme (statistical coding scheme) is further classified into a static coding scheme in which the probabilities of occurrence of respective symbols are predetermined, a semi-adaptive coding scheme in which first the probabilities of occurrence of respective symbols are obtained by scanning all the character strings, and an adaptive coding scheme in which every time a symbol appears, its frequency is updated and probabilities of occurrence are re-calculated. The invention relates to the adaptive coding scheme which does not depend on the data format and enables single-path coding.

FIGS. 16A–16D show how the tree structure and the codes are updated every time the frequencies of occurrence of respective symbols are changed. FIG. 16A shows a code tree that is generated at the initial stage. In FIGS. 16A–16D, a circular node means an internal node and a square node means a leaf. A numeral written in a circle or square that represents each node indicates a node number (rank). A numeral attached to the right shoulder of each node is a frequency of occurrence that is registered for the node. An alphabetical character written under each leaf means a registered symbol. Therefore, in the state of FIG. 16A, symbols "a" to "g" have frequencies of occurrence "7," "6," "5," "5," "3," "2" and "1," respectively.

When symbol "g" occurs in this state, the frequency of occurrence of node 15 is increased to "2" as shown in FIG. 16B after coding is performed according to the code tree of FIG. 16A. Accordingly, the frequencies of the parent node 13 and the ancestor nodes 9, 2 and 0 are incremented by one. Since the frequency "4" of node 13 becomes larger than the frequency 3 of the adjacent node 12, nodes 12 and 13 are interchanged. Similarly, their parent node 9 and node 8 are interchanged (see FIG. 16C). Since no reversal has occurred between the frequencies of their parent node 2 and node 1, they are not interchanged. Thus, the occurrence of one symbol "g" has changed the form of the code tree to the state shown in FIG. 17D.

FIGS. 17–24 show how the code tree changes as symbols occur one after another. If respective symbols have frequencies of occurrence shown in FIG. 18 in the initial state, the code tree assumes a form shown in FIG. 17. As shown in FIG. 18, according to this code three, "a" and "b" can be compressed into 2 bits, "c," "d" and "g" can be compressed into 3 bits, and "e" and "f" are compressed into 4 bits. When symbol "a" occurs 18 times in the state of FIGS. 17 and 18 to have a new frequency of occurrence "25," the code tree comes to assume a form shown in FIG. 19. As shown in FIG. 20, according to this code tree, "a" can be compressed into 1 bit, "b," "c" and "d" can be compressed into 2 bits, "g" is compressed into 4 bits, and "e" and "f" can be compressed into 5 bits. When symbol "g" occurs 16 times in this state to have a new frequency of occurrence "20," the code tree comes to assume a form of FIG. 21 and the compression amounts of the respective symbols become as shown in FIG. 22. When symbol "c" occurs 5 times in this state to have a new frequency of occurrence "10," the code tree comes to assume a form of FIG. 23 and the compression amounts of the respective symbols become as shown in FIG. 24.

In this manner, according to the adaptive coding scheme, as the frequency of occurrence of a symbol increases, the length of a codeword corresponding to that symbol is shortened, that is, the compression effect is enhanced. Where the code tree changes in the above manner as the process goes on, the same symbol has different codewords at the beginning and end of data. However, this causes no problems because the data decompression side generates the same code tree as the data compression side and the compression side updates the code tree after coding a symbol that newly occurs. The data decompression side can updates its own code tree in synchronism with the data compression side by recognizing a codeword that is output from the compression side. Thus, original symbols can be restored in spite of a variation in the correspondence between the codeword and the symbol.

In the above-mentioned static coding scheme and the semi-adaptive coding scheme, all symbols appearing in input data are registered in advance in a code tree and addition of symbols is not allowed. In contrast, in the adaptive coding scheme, symbols can additionally be registered because the probabilities of occurrence of respective symbols are re-calculated upon every occurrence of a symbol. Referring to FIG. 25, a procedure of additionally registering a symbol in the adaptive coding scheme will be described below.

First, as shown in part (a) of FIG. 25, in the initial state, only a code (hereinafter referred to as "escape code" or "ESC") meaning "non-registration" and a code (hereinafter referred to as "EOF") meaning the end of a file are registered in a code tree. In a state that a symbol that has newly occurred is not registered yet in the code tree, a codeword corresponding to ESC and raw data (i.e., data before compression) of the new symbol are output. Thereafter, the frequency of ESC is increased by "1" and new branches are generated from the node (leaf) having the lowest weight in the code tree. The symbol (having the lowest frequency of occurrence) of the original node is registered in one of the new leaves that have been generated by the branching, and the symbol for new registration is registered in the other leaf (see part (b) of FIG. 25).

The above description is directed to the case where adaptive coding is performed dynamically based on the probability of occurrence of each symbol. The compression effect can be enhanced by adaptive coding which uses a conditional probability of occurrence in which a dependence (hereinafter referred to as "context") of an input character on the immediately preceding character is taken into account. In a situation that it is highly probable that a character string will be generated according to a certain context, when the first symbol of the context occurs, a symbol that will occur next can be predicted to some extent, that is, predicted that it will be the next symbol of the context. Therefore, by preparing a code tree to be applied under the condition that the first symbol of the context has occurred, the length of a codeword corresponding to the next symbol can be shortened, that is, the compression ratio can be increased.

Where a conditional probability of occurrence in which "contexts" are taken into account is used, the contexts and characters for coding are expressed as a tree structure (hereinafter referred to as "context tree") as shown in FIG. 26A. Contexts (character string flows) that were input in the past are summarized in this context tree. Each node of the context tree is provided with a code tree that has a child node of the context tree as a leaf. The frequency of occurrence of the next symbol in each context is registered in the code tree. In this manner, the probability of occurrence of the next symbol in the case where a certain symbol has occurred can be determined as a conditional probability of occurrence.

There are two kinds of context collection methods which will be described below. In the first method, the order of conditions of the conditional probability is fixed, where the order means the length of a context used in determining a conditional probability. In this case, if the order is fixed to, for instance, 2, a conditional probability $P(Y|X1, X2)$ is obtained by collecting only the contexts that are connected to the two immediately preceding characters, where Y is the target coding character and X1 and X2 are the first and second immediately preceding characters, respectively. In the second method, the length of a condition character string is not fixed but is changed in accordance with input data. This type of context is called "blending context model".

As described above, the Huffman coding scheme provides the highest efficiency of data compression among the coding schemes using a code tree. In particular, being free of the need of retaining in advance the probabilities of occurrence of respective characters, the adaptive Huffman coding scheme can follow a variation of the probabilities of occurrence in one file.

However, the Huffman coding scheme cannot provide a maximum compression ratio higher than 0.125 (=⅛) when characters for coding are expressed in 1 byte, because in principle it is impossible to express one character for coding by a code of less than 1 bit.

SUMMARY OF THE INVENTION

An object of the present invention is to provide a data coding method, and a data compression apparatus which can increase the maximum compression ratio from the case where coding is performed according to a single coding scheme using a code tree. Another object of the invention is to provide a data decoding method, and a data decompression apparatus which can restore original data from codes that are outputted according to the above coding method or from the above data compression apparatus.

To accomplish the objects given above, a data compressing method of the present invention comprises a obtaining step for obtaining a character one after another from a compression target, a first coding step for outputting, when the character obtained by the obtaining step and a predetermined number of characters that have been consecutively obtained in the past in said obtaining step are not identical, a code corresponding to the character obtained in said obtaining step, and a second coding step for counting, while the character obtained in the obtaining step and a predetermined number of characters that have been consecutively obtained in the past in the obtaining step are identical, a number of characters obtained in said obtaining step, and outputting, when the character obtained in the obtaining step is not identical with the predetermined number of characters, a code corresponding to the number of characters counted.

Data compressed by the data compressing method is decompressed by a data compression method comprising a first decoding step and a second decoding step. In the first decoding step, when a predetermined number of characters that have been consecutively outputted by the first decoding step are identical, a code following the code used by the first decoding step in the decompression target is decoded, and characters identical with the predetermined number of the characters and equal in number to decoded result of the code are outputted.

A first data compressing apparatus according to the present invention comprises a obtaining unit, a first coding unit, a first controlling unit, a judging unit, a second coding unit, and second controlling unit.

The obtaining unit obtains a character one after another from a compression target. The first coding unit outputs a code corresponding to the character obtained by the obtaining unit. The first controlling unit for making, when the character obtained by the obtaining unit and a predetermined number of characters that have been recently used by the first coding unit are identical, the first coding unit stop functioning. The judging unit, which functions when the first coding unit does not function, for judging whether the character obtained by the obtaining unit is identical with a continuative character which is a character encoded in the last time by the first coding unit. The second coding unit for outputting, when the judging unit judges that the character is not identical with the continuative character, a code corresponding to a run-length which is a number of characters that have been judged to be identical with the continuative character. The second controlling unit for making, when the second coding unit outputs the code, the first coding unit start functioning.

The thus constructed first data compressing apparatus is capable of attaining a much higher compression ratio because of a part, which consists of same characters, in a compression target is converted into one code.

Data compressed by the first data compressing apparatus is decompressed by a data compression apparatus comprising a first decoding unit, a first controlling unit, a second decoding unit, and a second controlling unit.

The first decoding unit outputs a character corresponding to a code in a decompression target. The first controlling unit makes the first decoding unit stop functioning when a predetermined number of characters that have been consecutively outputted by the first decoding unit are identical. The second decoding unit, which functions when the first decoding unit does not function, decodes a code following the code used by the first decoding unit and outputs characters identical with the predetermined number of the characters and equal in number to decoded results of the code. The second controlling unit makes the first decoding unit start functioning when the second decoding unit outputs the characters.

A second data compressing apparatus according to the present invention is constructed by using a unit consisting of a code tables storing unit, a selecting unit, a code output unit, and a code table updating unit as the first coding unit in the first data compressing apparatus.

The code tables storing unit stores code tables corresponding to character strings respectively, each of the code tables indicates relation between codes and characters. The selecting unit selects a code table corresponding to a character string identical with a context that is a character string consisted of characters that have been obtained by the obtaining unit among the code tables in the code tables storing unit. The code output unit outputs a code corresponding to the character obtained by the obtaining unit by referring to the code table selected by the selecting unit. The code table updating unit updates the code table used by the code output unit so that a character frequently occurred after the context is related to a code with a shorter length than a character less frequently occurred.

Note that, it is desirable to use a code tables storing unit which stores the code tables holding a relation which is able to be expressed by a binary tree.

Data compressed by the second data compressing apparatus is decompressed by a second data compression apparatus constructed by modifying the first decompression apparatus.

The second data decompression apparatus includes a unit consisting of a decompression tables storing unit, a character output unit, a specifying unit, and a decompression table updating unit as the first decoding unit.

The decompression tables storing unit stores decompression tables corresponding to character strings respectively, each of the decompression tables indicates relation between characters and codes. The character output unit outputs a character corresponding to a code in a decompression target by referring to a decompression table in the decompression tables storing unit. The specifying unit specifies a decompression table to be used by the character output unit on the basis of a context which is a character string consisted of characters that have been consecutively outputted by the character output unit. The decompression table updating unit updates the decompression table used by the character output unit so that a character frequently occurred after the context is related to a code having a shorter length than a character less frequently occurred.

A third data compressing apparatus according to the present invention is constructed by using a unit consisting of a category table storing unit, a counting unit, a determining unit, a category data output unit, and a positional data output unit as the second decoding unit in the second data compressing apparatus.

The category table storing unit stores a category table which relates codes to a plurality of category data. The counting unit counts a number of characters which are judged to be identical with the continuative character by the judging unit. The determining unit determines, when the judging unit judges that the character is not identical with the continuative character, category data and positional data corresponding to the number counted by the counting unit. The category data output unit outputs a code corresponding to the category data determined by the determining unit with using the category table. The positional data output unit outputs a code which expresses the positional data determined by the determining unit and has a length corresponding to the category data determined by the determining unit.

The thus constructed third data compressing apparatus is capable of attaining a much higher compression ratio because a code corresponding to a run-length can be made shorter even when it becomes a large number.

Data compressed by the third data compressing apparatus is decompressed by a third data decompression apparatus constructed by modifying the first data decompression apparatus.

The third data decompression apparatus includes a unit consisted of a category table storing unit, category data obtaining unit, positional data specifying unit, a run-length determining unit, and a character output unit.

The category table storing unit for storing a category table which relates a plurality of category data to codes. The category data obtaining unit for obtaining a category data by encoding a code in the decompression target with using the category table in the category table storing unit. The positional data specifying unit specifies a positional data by obtaining a code having a length corresponding to the category data from the decompression target. The run-length determining unit for determining a run-length on the basis of the category data and the positional data. The character output unit for outputting characters identical with the continuative character and equal in number to the run-length determined by run-length determining unit.

BRIEF DESCRIPTION OF THE DRAWINGS

FIG. 7 shows an example of categories used in the second embodiment of the invention;

FIG. 15 shows a relationship between characters and codewords according to a code tree of FIG. 15;

DETAILED DESCRIPTION OF THE PREFERRED EMBODIMENTS

Embodiments of the invention will be hereinafter described with reference to the accompanying drawings.

Embodiment 1

A data compression apparatus in a first embodiment is characterized in that when the same characters have occurred consecutively in a compression target, compression is performed by coding a number of the consecutive occurrence, and that when the same data does not occur consecutively, compression is performed by using a context model. A data decompression apparatus in the first embodiment decompresses data compressed by the data compression apparatus.

<Data Compression Apparatus>

Figure 1:
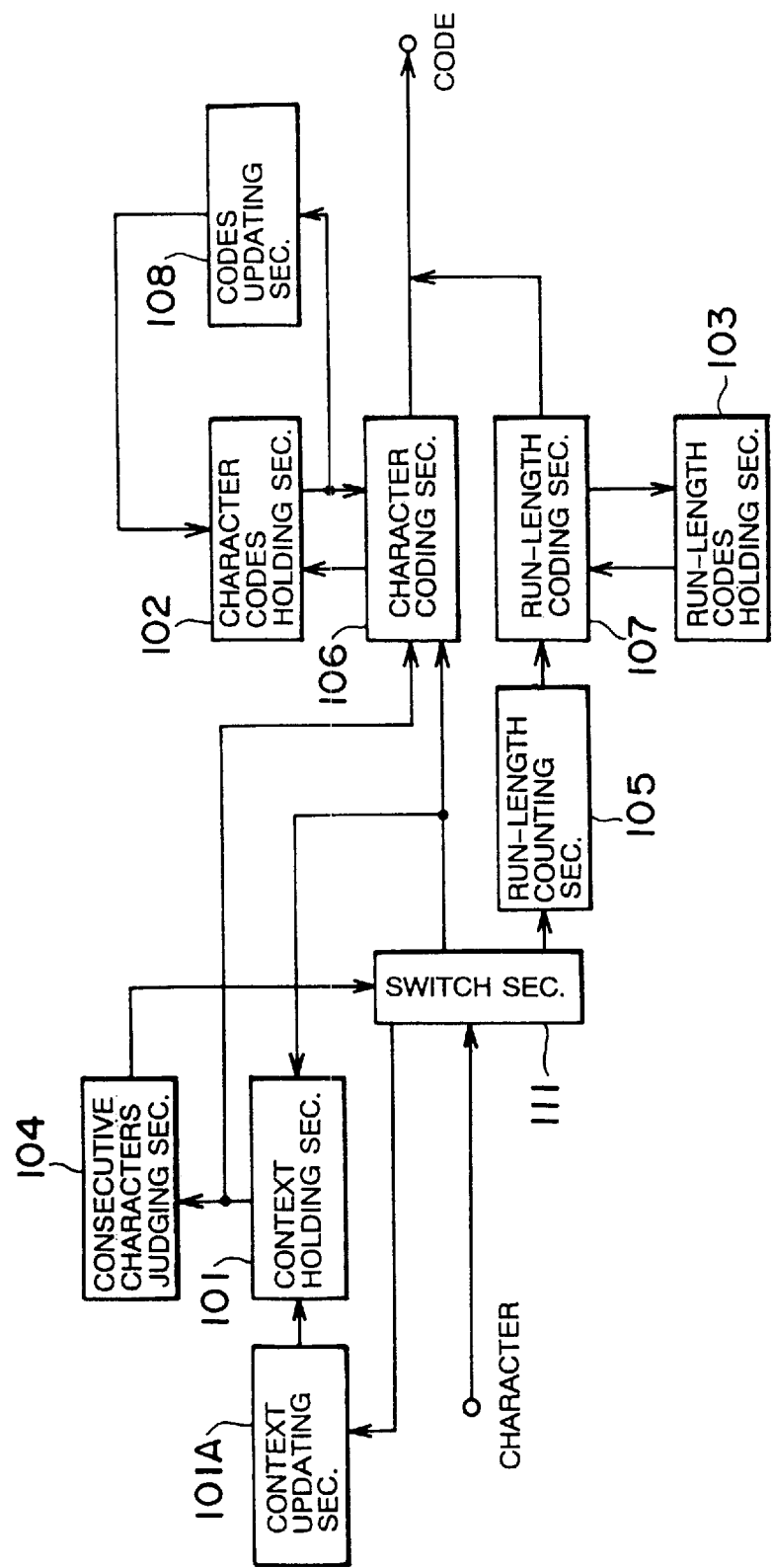
FIG. 1 is a block diagram showing the configuration of a data compression apparatus according to the first embodiment of the invention.

FIG. 1 illustrates the construction of the data compression apparatus in the first embodiment. As shown in FIG. 1, the data compression apparatus is composed of a switch section 111, a context holding section 101, a context updating section 101A, a consecutive characters judging section 104, a run-length counting section 105, a run-length coding section 107, a run-length codes holding section 103, a character coding section 106, a character codes holding section 102, and a codes updating section 108.

The character coding section 106, the character codes holding section 102, and the codes updating section 108 constitute a first coding section. The run-length counting section 105, the run-length coding section 107, and the run-length codes holding section 103 constitute a second coding section.

The context holding section 101 holds, a character K and its context. That is, it holds the character K to be encoded and a character string (i.e. the context) consisting of characters that have been inputted immediately before the character K.

Every time a new character K is input from the switch section 111, the context updating section 101A updates data held by the context holding section 101 as follows. The context updating section 101A discards the oldest character in the context and adds an old character K stored in the context holding section 101 to the context. Then, the context updating section 101A stores the new character K in the context holding section 101.

The consecutive characters judging section 104 judges, when the context updating section 101A updates data in the context holding section 101, whether the character K and characters of the context in the context holding section 101 are identical, and informs the switch section 111 of a judgment result.

Note that, the consecutive characters judging section 104 may be so constructed as to perform a judgment on the occurrence of consecutive, the predetermined number of identical characters with respect to only a particular character such as "20h" (representing a space in the ASCII codes) or "0h," where "h" indicates that the associated number is a hexadecimal number.

The switch section 111 receives a character K that is included in a original data and performs the following operations 1) to 3). Note that, the original data is supplied from a device (not shown) for coding inputs through a man-machine interface such as a keyboard or a mouse, or an external storage device (not shown) that stores data files.

1) When received a character K, the switch section 111 supplies the character K to the context updating section 101A and waits for information (a judging result) from the consecutive characters judging section 104.

2) When informed by the consecutive characters judging section 104 of the occurrence of the consecutive, the predetermined number of identical characters, the switch section 111 outputs the inputted character K to the run-length counting section 105 (the second coding section).

3) When informed by the consecutive characters judging section 104 of non-occurrence of the consecutive, the predetermined number of identical characters, the switch section 111 outputs the inputted character K to the character coding section 106 (the first coding section). In this case, if the information indicating occurrence of identical characters has been received in the last time, the switch section 111 informs the fact to the run-length section 105 before outputting the character K to the character coding section 106.

Encoding procedure in the first coding section will be described below.

The character codes holding section 102 holds a context tree and a plurality of code trees each of which corresponding to an internal node of the context tree.

Figure 26A:
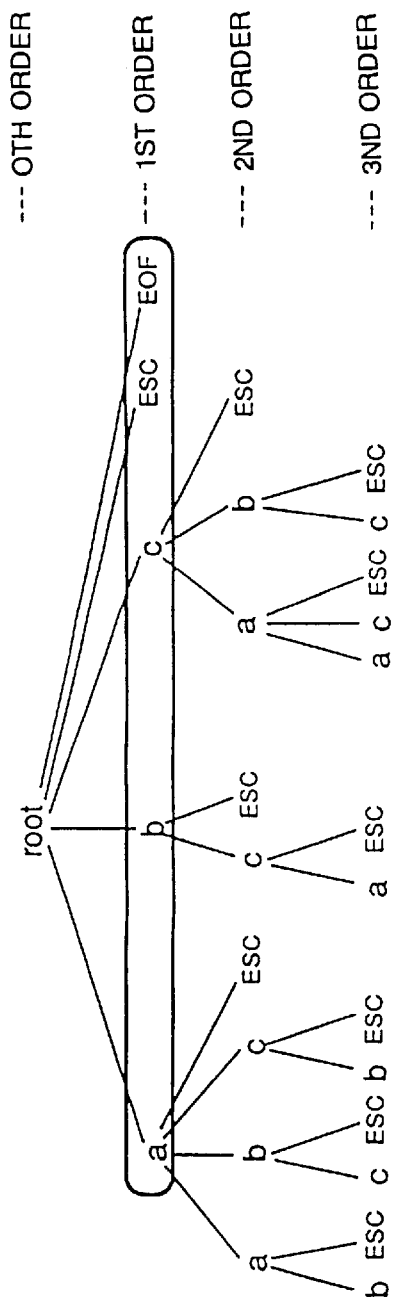
FIG. 26A shows a context tree.

The context tree is a structure summarizing contexts (each being a pattern of a sequence of a plurality of characters) that occurred in the past. The example of FIG. 26A shows that contexts such as "aab," "abc," "acb," "bca," "caa," "cac" and "cbc" occurred in the past. Unlike the case of the code tree, in the context tree, every node (whether it is a leaf or an internal node) other than the root is assigned a character. Since the context tree is used only for the purpose of providing conditions and is not directly used for coding, there may occur a case that three or more branches come out of a certain internal node. Each branch is not assigned a code. Further, to provide for occurrence of a context that does not match even one character of any 3-character context of the context tree or a context that matches only one or two character of a 3-character context, a non-occurrence symbol (ESC) is connected to each internal node. To indicate the end of a file, an end symbol (EOF) is connected to the root. In the context tree, the term "order" is used for the "level."

It is considered that in a state that a character corresponding to an internal node has occurred, probabilities for respective characters to occur next have a larger deviation than in the unconditional case. That is, it is considered that characters that are included in the contexts that occurred in the past should have higher probabilities of occurrence than the other characters. Therefore, under the condition that a certain character has occurred, coding can be performed even if a code tree for coding only the characters that are included in a context following that character is applied. Further, the code tree size is reduced by using such a conditional code tree, because it restricts characters for coding. As a result, codewords have shorter code lengths and the compression efficiency is thereby improved.

Figure 26B:
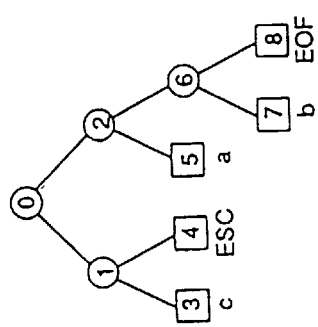
FIG. 26B shows a code tree corresponding to the root of the context tree of FIG. 26A.

For the above reasons, each internal node of a context tree is provided with a code tree which has, as leaves, characters (including ESC and EOF) of next-level nodes that are directly connected to the internal node concerned. FIG. 26B shows, among those code trees, a code tree that is prepared for the root of the context tree of FIG. 26A. In these code trees, characters having a possibility of occurring next are given shorter code lengths. That is, characters included in a context having a higher probability of occurrence have larger compression ratios.

The character coding section 106 selects one of the code trees held by the character codes holding section 102 based on the context stored in the context holding section 101. Then, the character coding section 106 traces the path of the selected code tree from the root to the leaf where the input character K is stored, and sequentially picks up codes of "0" or "1" that are attached to the branches of the path, thus outputting a code (codeword).

The codes updating section 108 updates the code tree used for encoding the character K in the character codes holding section 102 based on the occurrence frequency of each character after the context.

Thus, the first coding section encodes the input character K in accordance with a frequency of occurrence of the combination of the context and the input character K and outputs a resulting code. Moreover, the first coding section updates code trees as the data compression (coding) goes on.

Next, encoding procedure in the second coding section will be described.

The run-length counting section 105 counts a number of characters from the switch section 111. When informed of non-occurrence of identical characters from the switch section 111, the run-length counting section 105 informs of the number of characters (hereinafter called "run-length L") counted to the run-length coding section 107.

The run-length codes holding section 103 holds a table that correlates various numerals N with various codes. Table 1 exemplifies the contents of the table.

TABLE 1

| Numeral N | Code |
|---|---|
| 6 | 1101 |
| 14 | 1111000 |
| ... | ... |
| 126 | 11110110 |

The run-length coding section 107 reads, from the table in the run-length codes holding section 103, a code corresponding to a run-length L (numeral N) that is outputted from the run-length counting section 105, and outputs the readout code.

<Data Decompression Apparatus>

Figure 2:
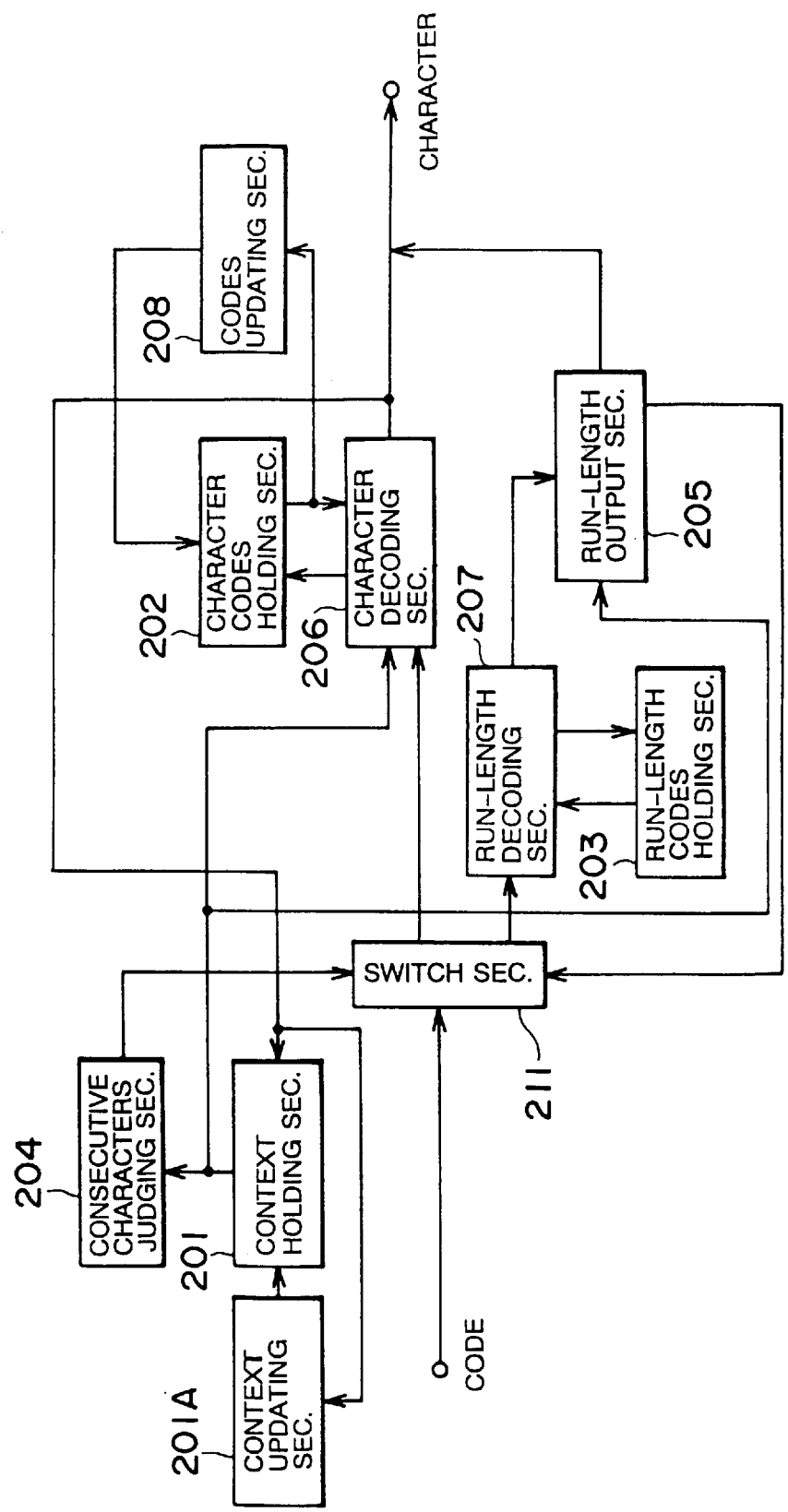
FIG. 2 is a block diagram showing the configuration of a data decompression apparatus according to the first embodiment of the invention.

As shown in FIG. 2, the data decompression apparatus in the first embodiment is composed of a switch section 211, a context holding section 201, a context updating section 201A, a consecutive characters judging section 204, a run-length decoding section 210, a run-length codes holding section 203, a run-length output section 205, a character decoding section 206, a character codes holding section 202, and a codes updating section 208.

The character decoding section 206, the character codes holding section 202, and the codes updating section 208 constitute a first decoding section. The run-length decoding section 207, the run-length codes holding section 203, and the run-length output section 205 constitute a second decoding section.

The context holding section 201 holds a context which is a character string consisting of characters outputted by the character decoding section 206.

Every time a character is outputted by the character decoding section 206, the context updating section 201A discards the oldest character in the context held by the context holding section 201 and adds the character.

The consecutive characters judging section 204 judges whether the predetermined number of consecutive characters, including the character added in the last time, in the context held by the context holding section 201 are identical, and informs the switch section 211 of a judgment result.

The switch section 211 performs the following operations 1) to 3).

1) The switch section 211 receives bit data in a target data which is obtained with using the data compression apparatus in the first embodiment.

2) When informed by the consecutive characters judging section 204 of the occurrence of the consecutive, the predetermined number of identical characters, the switch section 211 starts to output, to the run-length decoding section 207 (the second decoding section), bit data that are thereafter input.

3) When informed by the run-length output section 205 of completion of decoding, the switch section starts to output, to the character decoding section 206 (the first decoding section), bit data that are thereafter input.

Decoding procedure in the first decoding section will be described below.

The character codes holding section 202 holds a context tree and code trees each of which corresponding to an internal node of the context tree. The contents of the context tree and code trees in the character codes holding section 202 are identical with those in the character codes holding section 102 of the data compression apparatus.

The character decoding section 206 selects one of the code trees held by the character codes holding section 202 based on the context in the context holding section 201. Then, the character coding section 206 traces the branches of the selected code tree from the root in the order of 0's and 1's indicated by the bit data (codeword), to find the corresponding leaf. The character coding section 206 outputs a character that is correlated with the leaf thus found.

The codes updating section 208 updates the code tree used for decoding a code in the character codes holding section 202 on the basis of occurrence frequency of the decoded character after the context.

Next, decoding procedure in the second decoding section will be described.

The run-length codes holding section 203 holds a table that correlates various numerals N with various codes. The contents of the run-length codes holding section 203 are identical with those of the run-length codes holding section 103 of the data compression apparatus.

The run-length decoding section 207 reads, from the table in the run-length codes holding section 203, a numeral N corresponding to a code that is inputted from switch section 211, and outputs the readout numeral N (the run-length) to the run-length output section 205.

The run-length output section 205 outputs the end character of the context held by the context holding section 201 the number of times equal to the numeral N supplied from the run-length decoding section 207. Then, the run-length output section 205 informs of the completion of the encoding to the switch section 211.

Hereinafter, the processing of the data compression apparatus and the data decompression apparatus will be hereinafter described with reference to flowcharts.

First, the processing of the data compression apparatus will be described with reference to FIG. 3.

Figure 3:
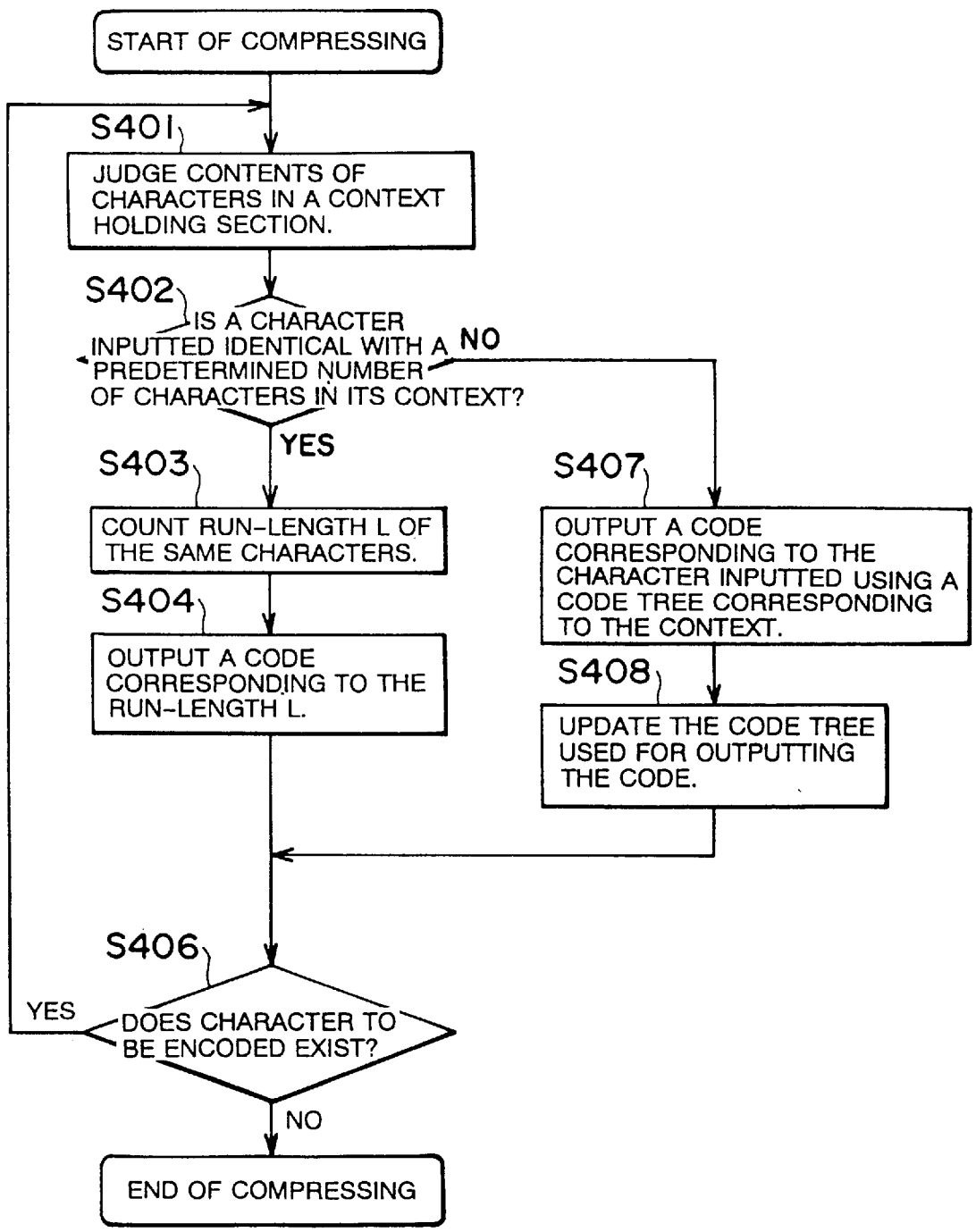
FIG. 3 is a flowchart showing the processing of the data compression apparatus according to the first embodiment of the invention.

As shown in FIG. 3, when a compression process is started, the consecutive characters judging means 104 judges whether the input character and the predetermined number of characters in the context are identical (S401). If the judgment result is YES (S402;YES), the run-length L is counted in the second coding section (S403), and a code corresponding to the run-length L is outputted (S404).

On the other hand, if the judgment result at step S401 is NO (S402;NO), a code is outputted from the first coding section on the basis of a code tree corresponding to the context of the input character (S407). This coding is performed according to the procedure of the above-described coding scheme using a code tree. That is, symbols are registered in the ends (leaves) of a code tree, and a distance from the top (root) of the code tree to a leaf where the input data is stored is output as a code length. More specifically, in tracing from the root to the leaf, the codeword is assigned "1" in the case of rightward branching and "0" in the case of leftward branching.

Then, the code tree is updated on the basis of the occurrence frequency of the characters in the past (S408). That is, the code tree is updated so that a character frequently occurred after the context is related to a code with a shorter length than a character less frequently occurred. Concretely, nodes exchanging process of the adaptive Huffman coding or splaying process of the Splay-Tree coding is used for the update.

After the execution of step S404 or S408, if there is no character to be encoded (S406;NO), the compression process is finished. If there exists a character to be encoded (S406;YES), the flow returns to step S401 to continue the compression process.

Next, the processing of the data decompression apparatus will be described with reference to FIG. 4.

Figure 4:
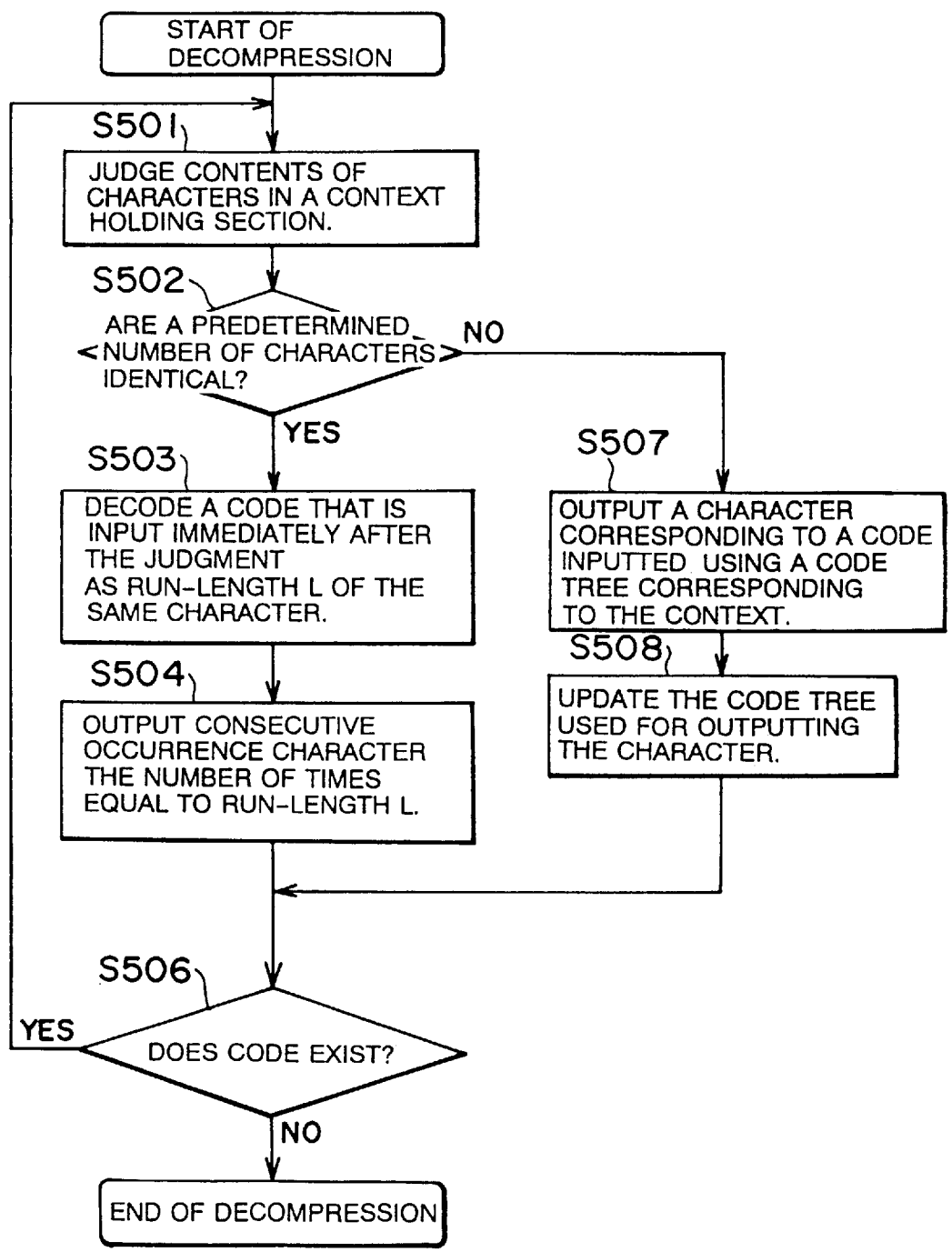
FIG. 4 is a flowchart showing the processing of the data decompression apparatus according to the first embodiment of the invention.

As shown in FIG. 4, when a decompression process is started, the consecutive characters judging means 204 judges whether the predetermined number of characters in the context held by the context holding section 201 are identical (S501). If the judgment result is YES (S502;YES), a code (some bits data) is decoded as a run-length of the same characters in the second decoding section (S503). Then, the second decoding section outputs a character identical with the end character in the context holding section 201 the number of times equal to the run-length (S504).

On the other hand, if the judgment result at step S501 is NO (S502;NO), the first decoding section outputs a character corresponding to the code that is inputted immediately after the judgment (S507), and updates the code tree used for decoding the code (S508).

After the execution of step S504 or S508, if there is no code to be decoded (S506;NO), the decompression process is finished. If there exists a code to be decoded (S506;YES), the flow returns to step S501 to continue the decompression process.

Embodiment 2

The second embodiment is the same as the first embodiment except for the second coding means of the data compression apparatus and the second decoding means of the data decompression apparatus. Therefore, no description will be made of the common features.

<Data Compression Apparatus>

Figure 5:
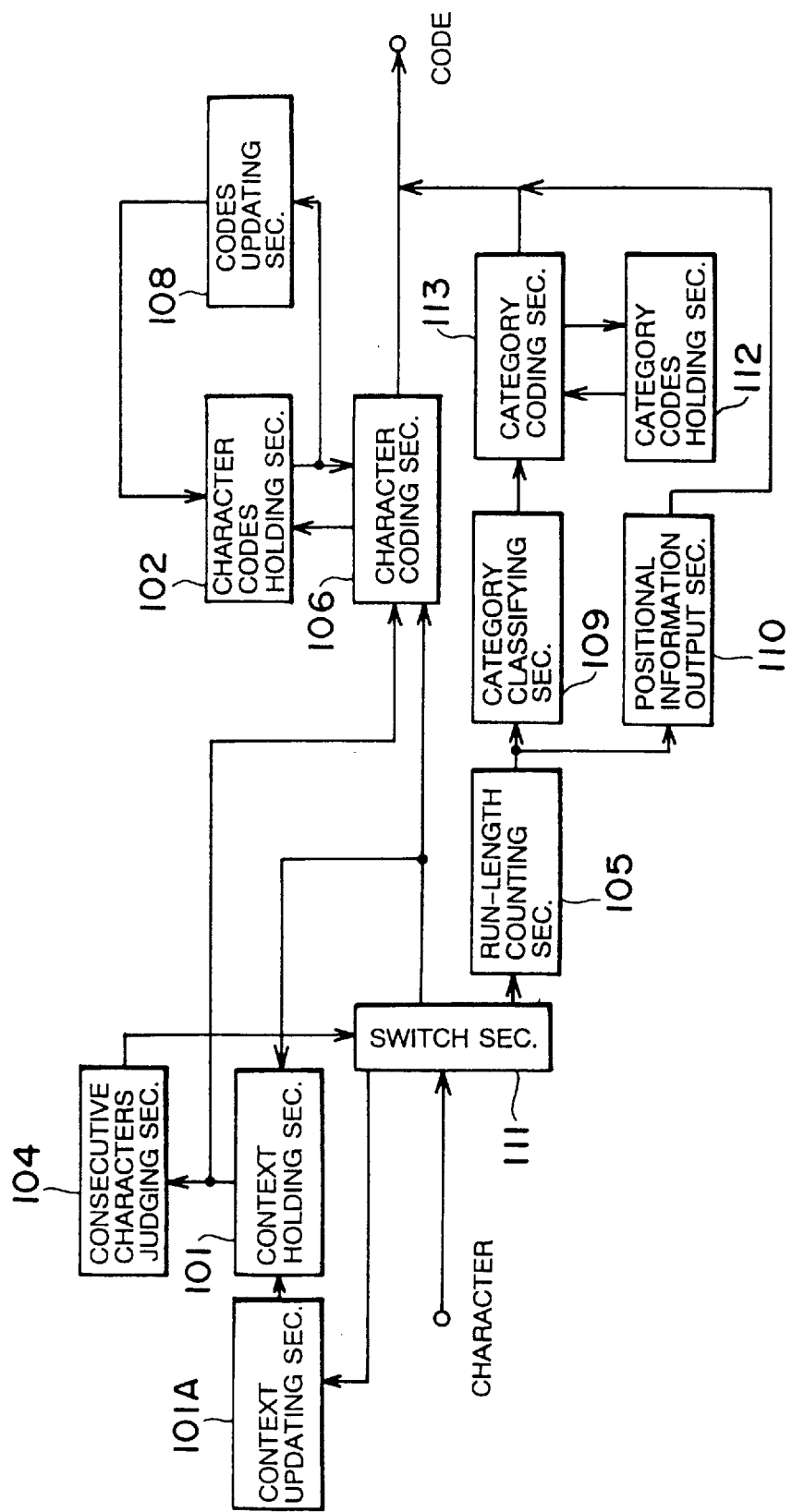
FIG. 5 is a block diagram showing the configuration of a data compression apparatus according to a second embodiment of the invention.

As shown in FIG. 5, the data compression apparatus is composed of a switch section 111, a context holding section 101, a context updating section 101A, a consecutive characters judging section 104, a run-length counting section 105, a category classifying section 109, a category coding section 113, a positional information output section 110, a category codes holding section 112, a character coding section 106, a character codes holding section 102, and a codes updating section 108.

The run-length counting section 105, the category classifying section 109, the category coding section 113, the positional information output section 110, and the category codes holding section 112 constitute the second coding section.

The run-length counting section 105 counts a number of characters (the run-length L) supplied from the switch section 111, and outputs, when informed by the switch section 105 of input of non-identical character, the run-length L to the category classifying section 109 and the positional information output section 110.

Based on the run-length L that has been supplied from the run-length counting section 105, the category classifying section 109 determines a category C that satisfies Formula (1) and informs the category coding section 113 of the calculated value of C.

$$8 \times C \leq L < 8 \times (C+1) \qquad (1)$$

That is, the category classifying section 109 determines category C by calculating a quotient of division of the run-length L by 8. In other words, the category classifying section 109 assigns one category C to a plurality of run-lengths. For example, the category classifying section 109 assigns a category C that is given an identifier C=2 to run-lengths L of 16 to 23 as shown in FIG. 7.

The category codes holding section 112 holds a table that correlates identifiers of various categories C with various codes.

The category coding section 113 reads, from the category codes holding section 112, a code corresponding to the identifier of the category C which has been inputted from the category classifying section 109, and outputs the readout code.

The positional information output section 110 calculates, according to Equation (2), positional information indicating the position of the run-length L in the category determined by the category classifying section 109.

$$(\text{Positional information}) = L - 8 \times C \qquad (2)$$

Then, the positional information output section 110 outputs the calculated positional information in a form of 3 bits data so that the data follows the code outputted from the category coding section 113.

For example, the positional information output section 110 outputs "000" (=0) as the positional information for a run-length L having a value 16, and outputs "010" (=2) for a run-length L having a value 18.

Figures 8A, 8B:
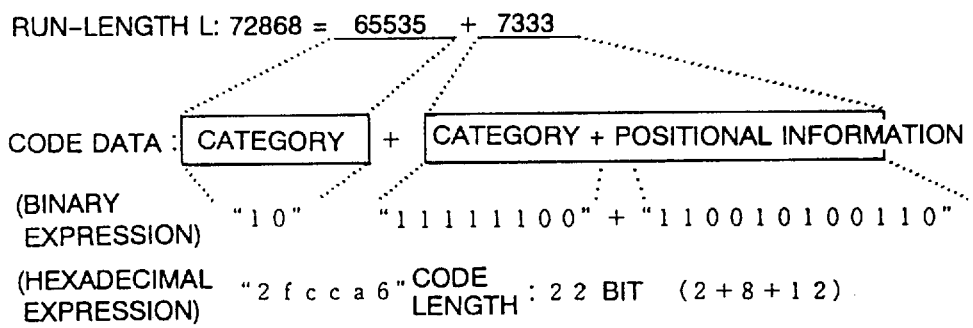
FIGS. 8A and 8B show an example of category classification in the second embodiment of the invention.

Note that, for data including a very large run-length, the category classifying section 109 may be constructed so as to perform category classification by using powers of 2. That is, as shown in FIGS. 8A and 8B, a section which assigns a category C to run-lengths L which satisfy $2^c-1 \leq L < 2^{c+1}-1$ can be used as the category classifying section. In this case, a section which outputs a positional data having C bits is used as the positional information output section.

Furthermore, it is desirable to construct the category classifying section so as to output some maximum categories and a category when receiving a run-length L over 65,535, which is the maximum run-length in FIG. 8B. That is, as schematically shown in FIG. 8A, it is desirable to construct the category classifying section so as to output, when receiving a run-length L=72,868, a code of C=16 (no positional information is needed because the category C=16 contains only L=65,535) first and a code of C=12 for the residual run-length L=7,333 (i.e., 72,868−65,535) and the positional information for 7,333 second.

<Data Decompression Apparatus>

Figure 6:
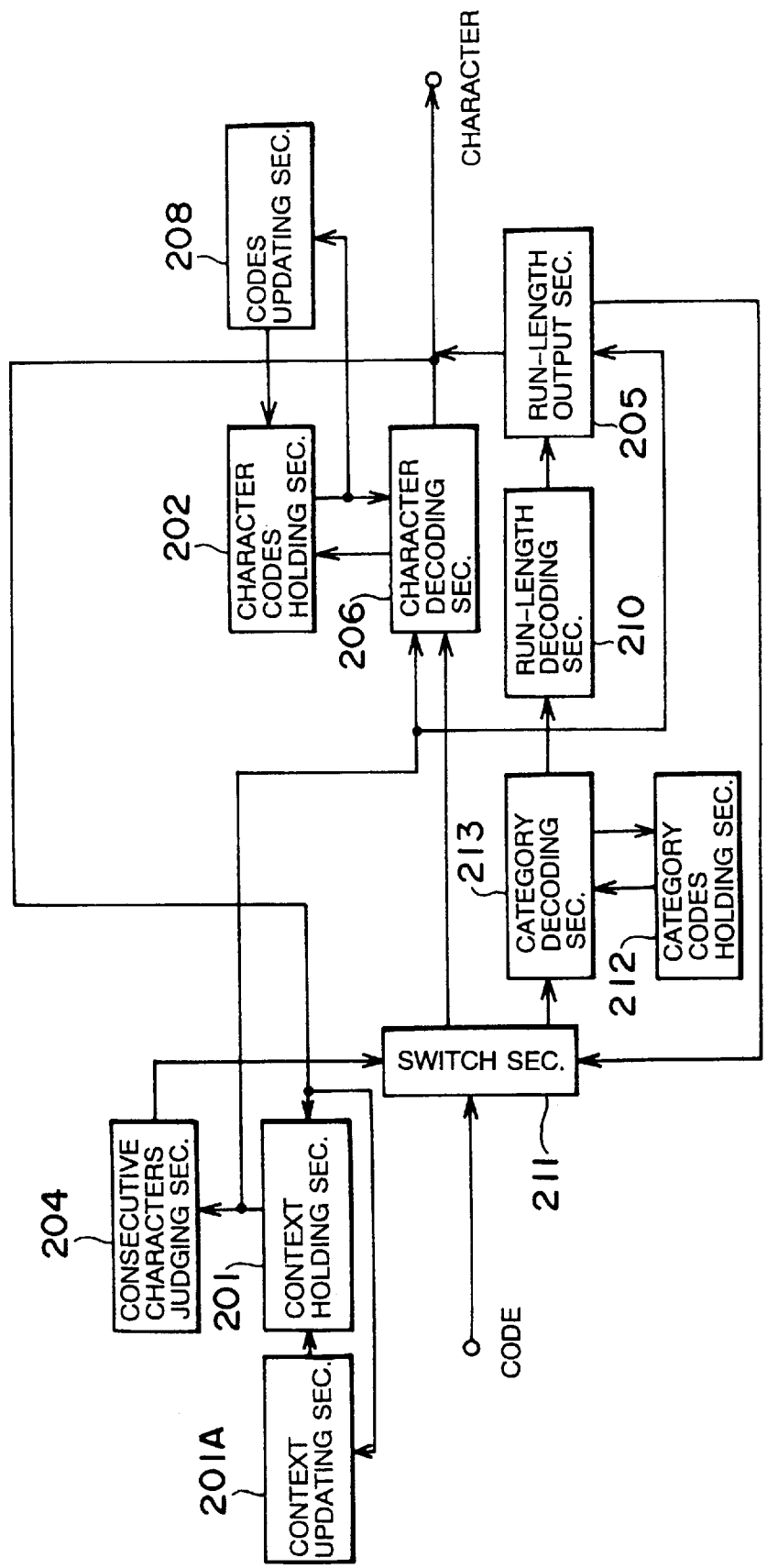
FIG. 6 is a block diagram showing the configuration of a data decompression apparatus according to the second embodiment of the invention.

As shown in FIG. 6, the data decompression apparatus of the second embodiment is composed of a switch section 211, a context holding section 201, a context updating section 201A, a consecutive characters judging section 204, a category decoding section 213, a category codes holding section 212, a run-length decoding section 210, a run-length output section 205, a character decoding section 206, a character codes holding section 202, and a codes updating section 208.

The category decoding section 213, the category codes holding section 212, the run-length decoding section 210, and the run-length output section 205 constitute the second decoding section.

The switch section 211 performs the following operations 1) to 3).

1) It receives bit data from a target data compressed by the data compression apparatus in the second embodiment.

2) When informed by the consecutive characters judging section 204 of the occurrence of the consecutive, the predetermined number of identical characters, it starts to output, to the run-length decoding section 207, bit data that are thereafter input.

3) When informed by the run-length output section 205 of completion of decoding, it start to output, to the character decoding section 206, bit data that are thereafter input.

The category codes holding section 212 holds a table which correlates identifiers of various categories C with various codes. The contents of the category codes holding section 212 are the same as those of the category codes holding section 112 of the data compression apparatus.

The category decoding section 213 reads, from the category codes holding section 212, an identifier of a category C which corresponds to the code that is inputted from the switch section 211. Further, the category decoding section 213 recognizes, as positional information, 3 bits data that is subsequently supplied from the switch section 211. Then, the category decoding section 213 outputs the identifier of the category C and the positional information to the run-length decoding section 210.

The run-length decoding section 210 determines a run-length L on the basis of the identifier of the category C and the positional information that have been supplied from the category decoding section 213. Then, the run-length decoding section 210 outputs the determined run-length L to the run-length output section 205.

The run-length output section 205 outputs the characters identical with the end character in the context holding section 201 the number of times equal to the run-length L and informs the completion of encoding (outputting characters) to the switch section 211.

Hereinafter, the processing of the data compression apparatus and the data decompression apparatus will be explained with reference to flowcharts.

First, the processing of the data compression apparatus will be explained with reference to FIG. 9.

Figure 9:
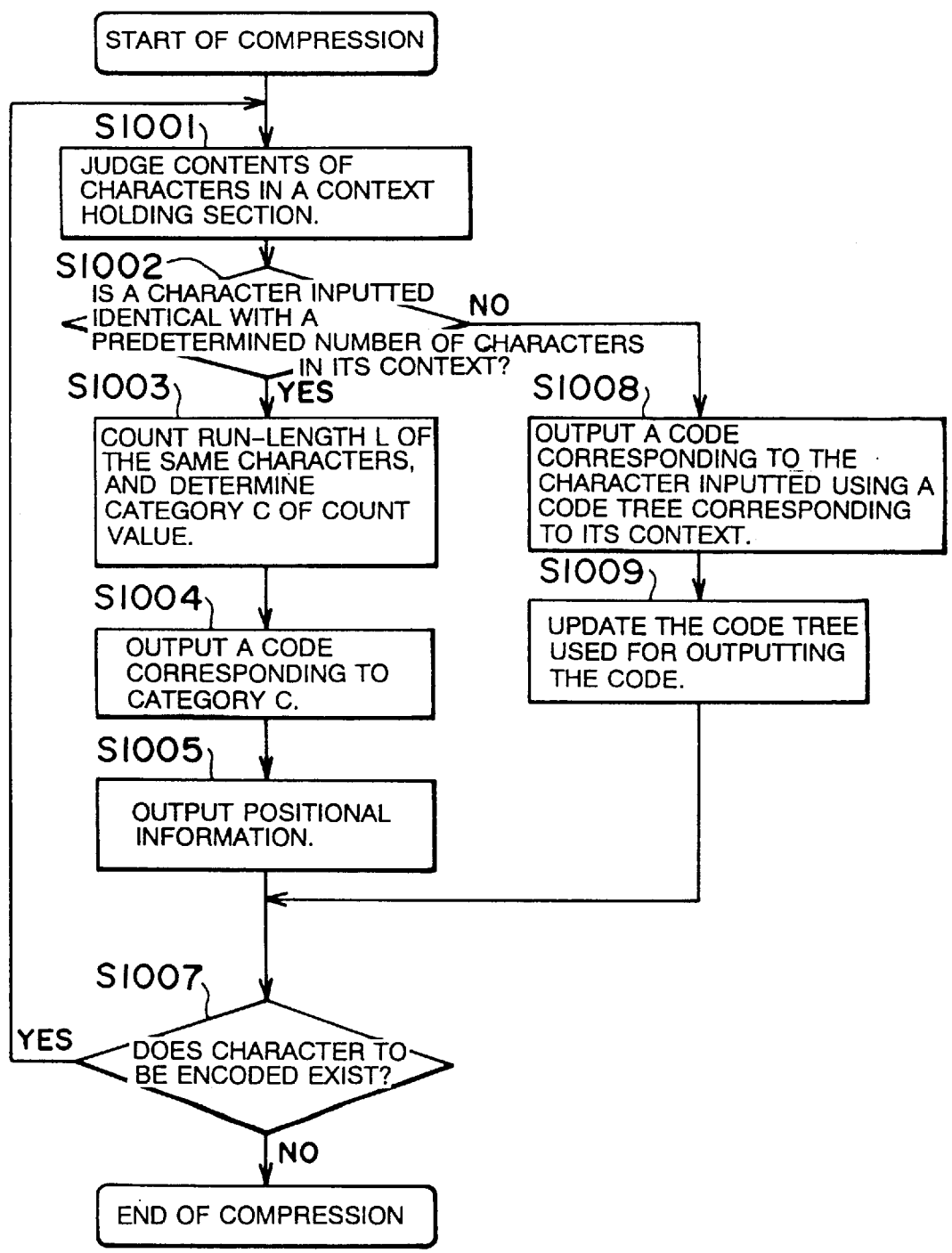
FIG. 9 is a flowchart showing the processing of the data compression apparatus according to the second embodiment of the invention.

As shown in FIG. 9, when a compressing process is started, the consecutive characters judging means 104 judges whether the input character and the predetermined number of the characters of the context in the context held by the context holding section 101 are identical (S1001). If the judgment result at step S1001 is YES (S1002;YES), the second coding section determines a category C of a run-length of the same characters (S1003), encodes the category C and outputs the encoded result (S1004). Next, the second coding section outputs a positional information (S1005).

On the other hand, if the judgment result at step S1001 is NO (S1002;NO), the first coding section encodes the input character according to a code tree corresponding to the context of the input character (S1008), and updates the code tree (S1009).

After the execution of step S1005 or S1009, if there is no character to be encoded (S1007;NO), the compression process is finished. If there exists an input character (S1007;YES), the flow returns to step S1001 to continue the compression process.

Figure 10:
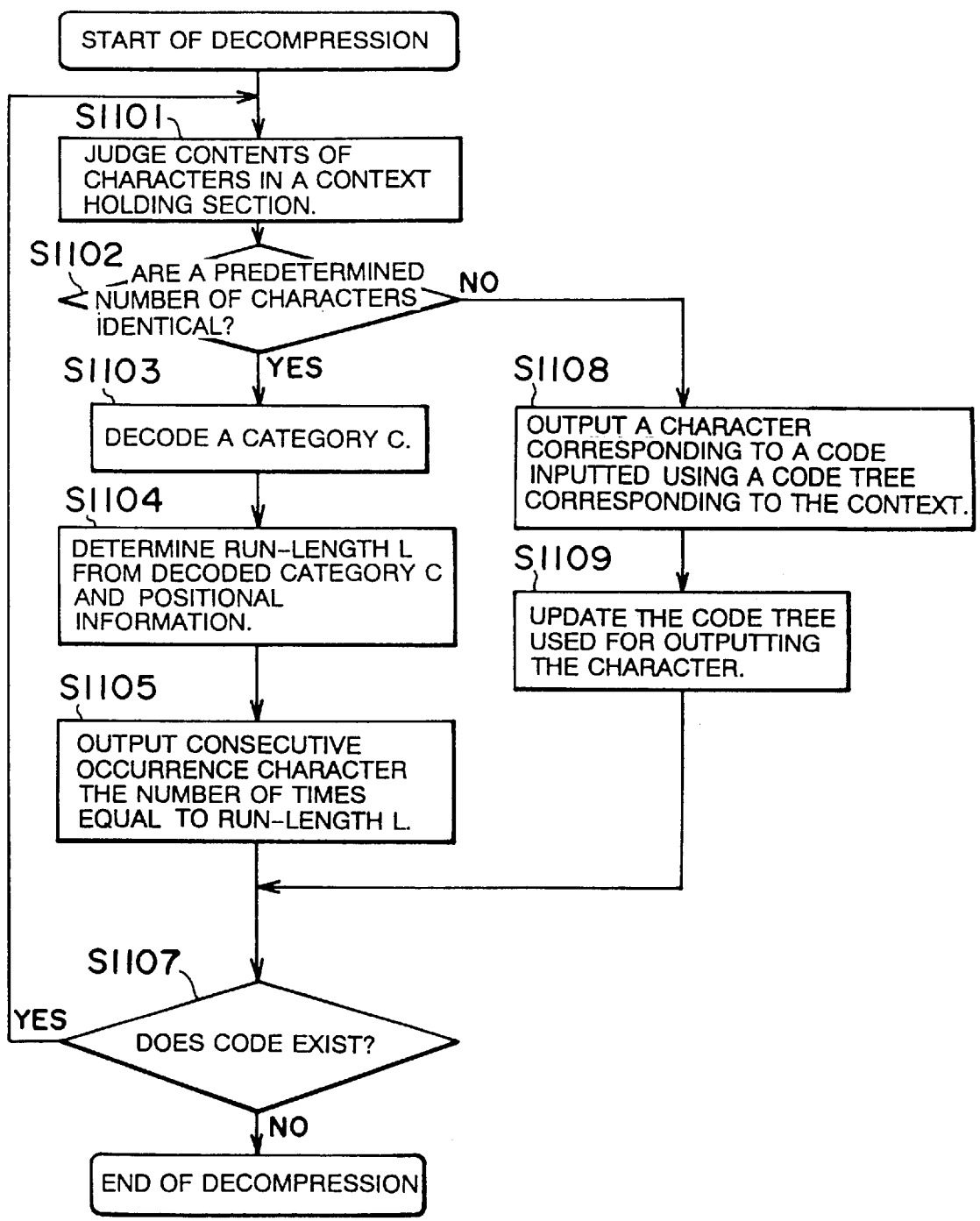
FIG. 10 is a flowchart showing the processing of the data decompression apparatus according to the second embodiment of the invention.

Next, the processing of the data decompression apparatus will be explained with reference to FIG. 10.

When a decompression process is started, the consecutive characters judging means 204 judges whether the predetermined number of the characters in the context held by the context holding section 201 are identical (S1101). If the judgment result is YES (S1102;YES), the second decoding section decodes a category C (S1103), determines a run-length L from the decoded category C and positional information (S1104). Next, the second decoding section outputs, the number of times equal to the run-length L, the character with which the consecutive occurrence has been found at step S1101 (S1105).

On the other hand, if the judgment result at step S1101 is NO (S1102;NO), the first decoding section outputs a character corresponding to a code using a code tree with respect to the context in the context holding section 201 (S1108), and updates the code tree (S1109).

After the execution of step S1105 or S1109, if there is no code to be decoded (S1107;NO), the decompression process is finished. If there exists a code (S1107;YES), the flow returns to step S1101 to continue the decompression process.

Embodiment 3

The third embodiment is the same as the first embodiment except that the data compression apparatus and the data decompression apparatus encodes or decodes a run-length dynamically. Therefore, no description will be made of the common features.

Figure 11:
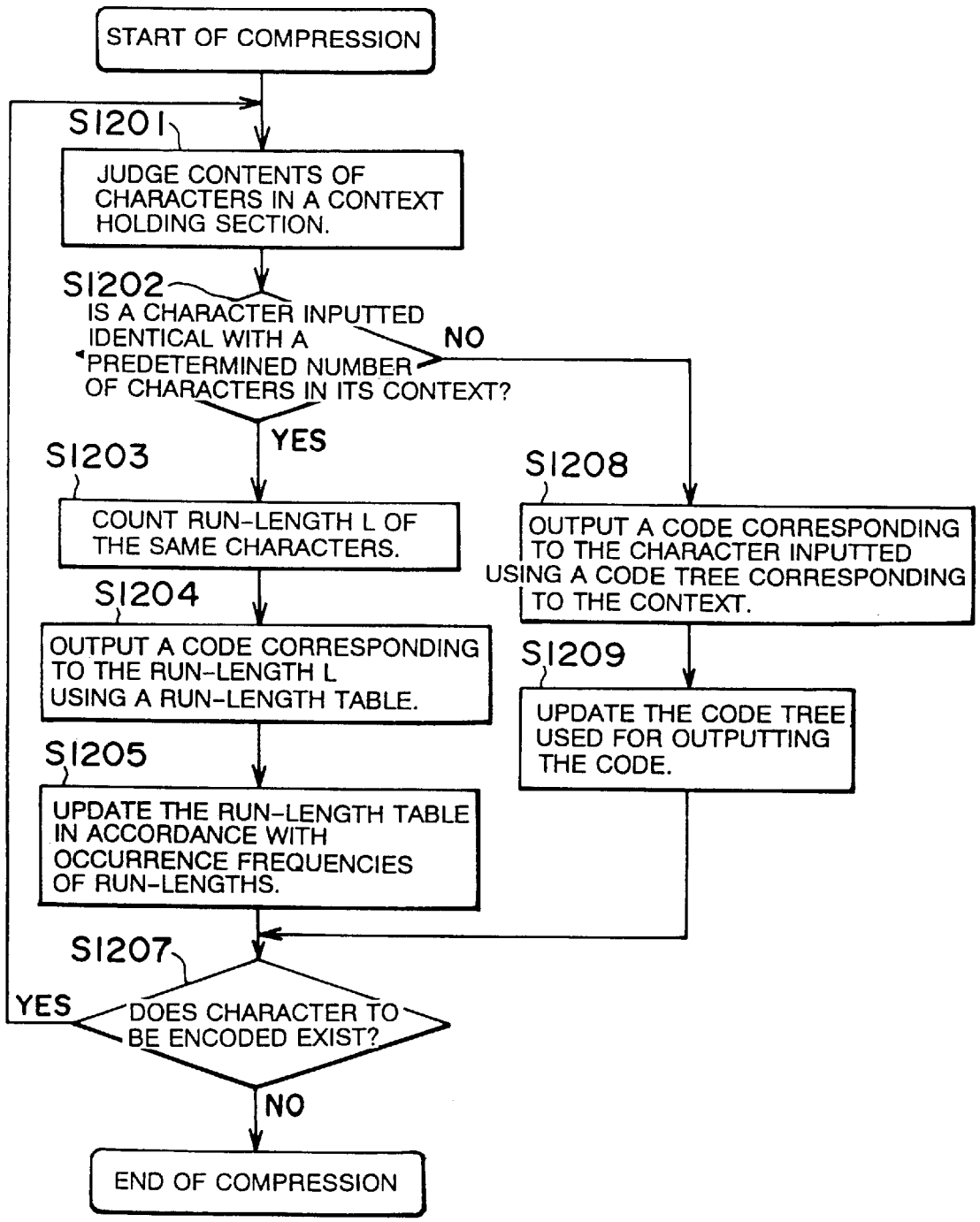
FIG. 11 is a flowchart showing the processing of a data compression apparatus according to a third embodiment of the invention.

First, the processing of the data compression apparatus will be described with reference to FIG. 11.

When a compression process is started, the consecutive characters judging means 104 judges whether the input character and the predetermined number of consecutive characters of the context in the context holding section 101 are identical (S1201). If the judgment result is YES (S1202;YES), the second coding section counts the run-length L (S1203), and outputs a code corresponding to the run-length L in a run-length table (S1204). Then, the second coding section updates the run-length table in accordance with the occurrence frequencies of the run-lengths (S1205). That is, the second coding section updates the run-length table so that a run-length frequently occurred is related to a code with a shorter length than a run-length less frequently occurred.

On the other hand, if the judgment result at step S1201 is NO (S1202;NO), the first coding section outputs a code corresponding to the input character with using a code tree with respect to the context of the input character (S1208), and updates the code tree based on the occurrence frequencies of characters after the context (S1209).

After the execution of step S1205 or S1209, if there is no character to be encoded (S1207;NO), the compressing process is finished. If there exists a character (S1207;YES), the flow returns to step S1201 to continue the compression process.

Figure 12:
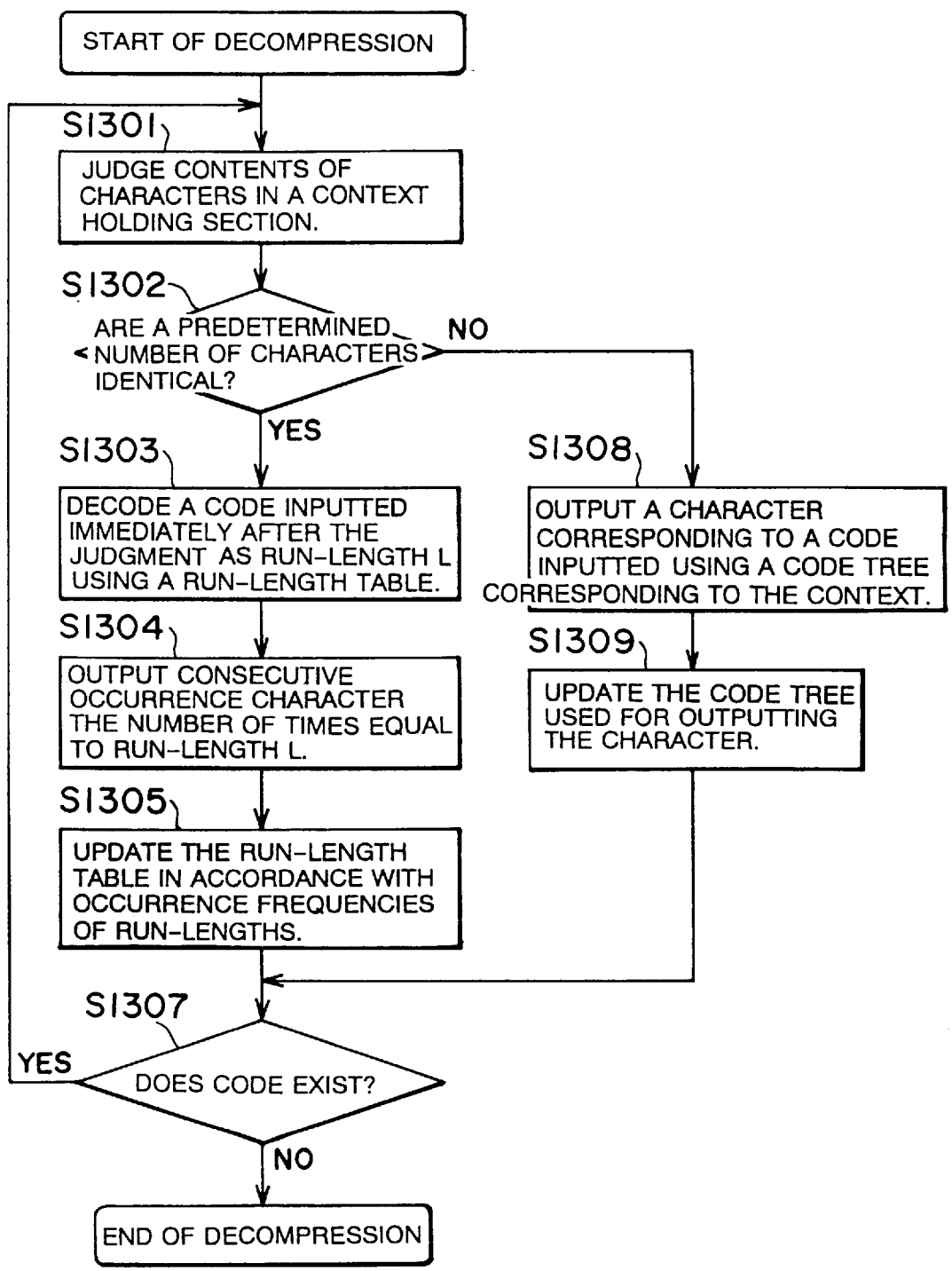
FIG. 12 is a flowchart showing the processing of a data decompression apparatus according to the third embodiment of the invention.
Figure 13:
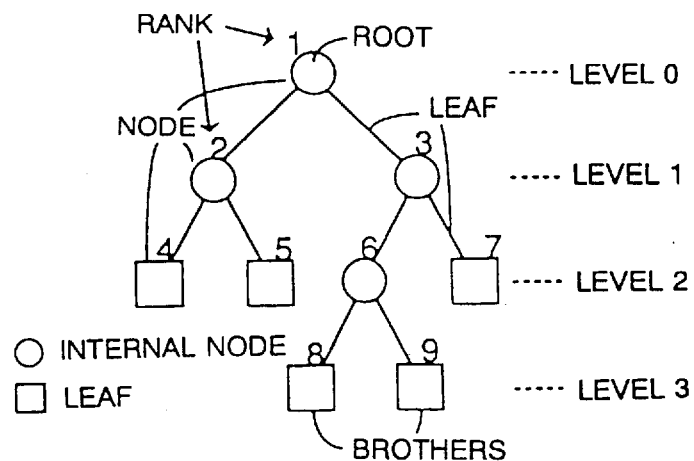
FIG. 13 shows the names of elements of a code tree.
Figure 14:
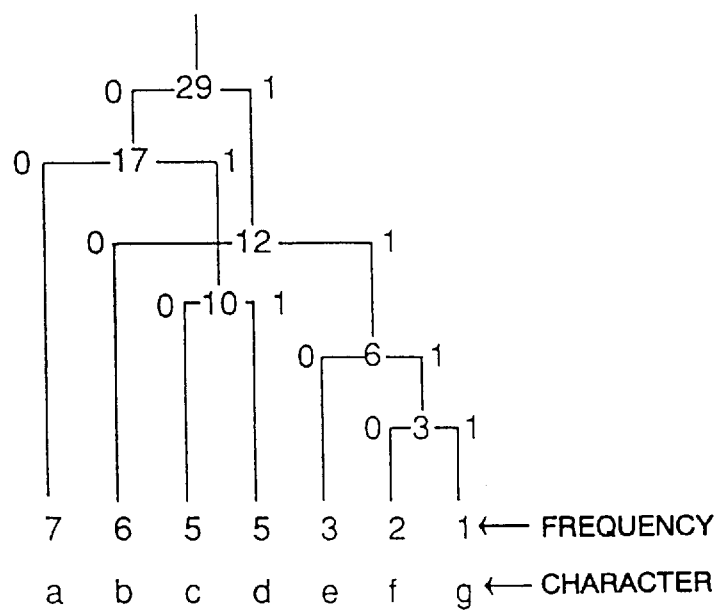
FIG. 14 shows the principle of a Huffman coding scheme.
Figure 16A:
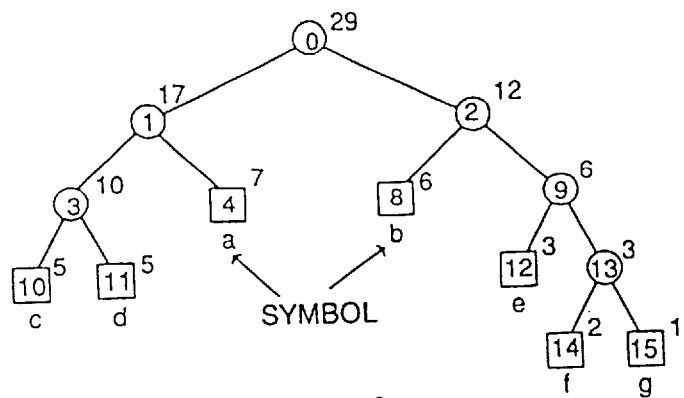
FIGS. 16A–16D show the principle of an adaptive coding scheme.
Figure 16B:
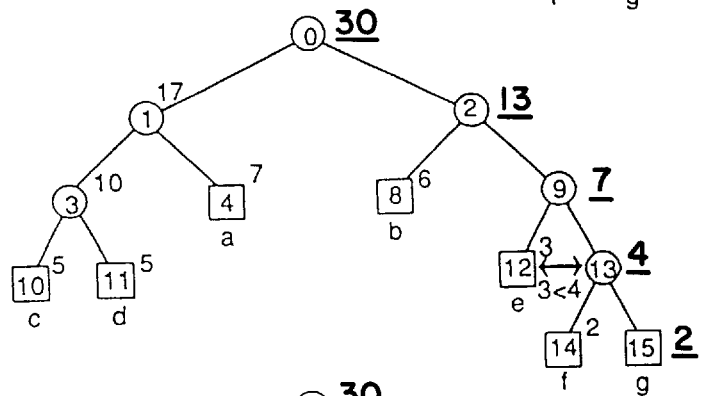
Figure 16C:
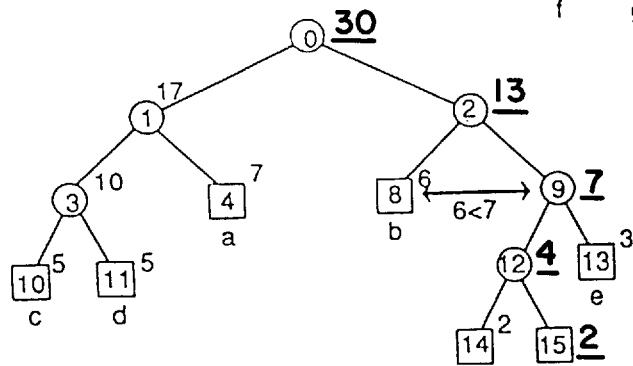
Figure 16D:
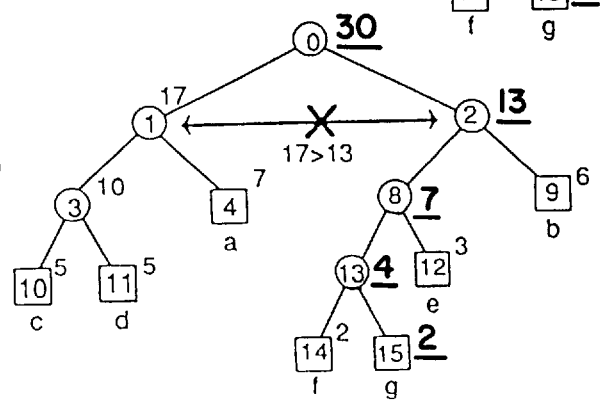
Figures 17, 18:
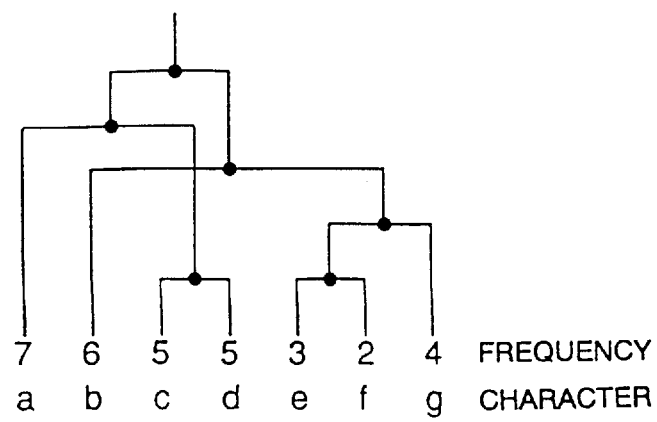
FIG. 17 shows an example of a code tree in the initial state according to the adaptive coding scheme.
FIG. 18 shows a relationship between characters and codewords according to the code tree of FIG. 18.
Figures 19, 20:
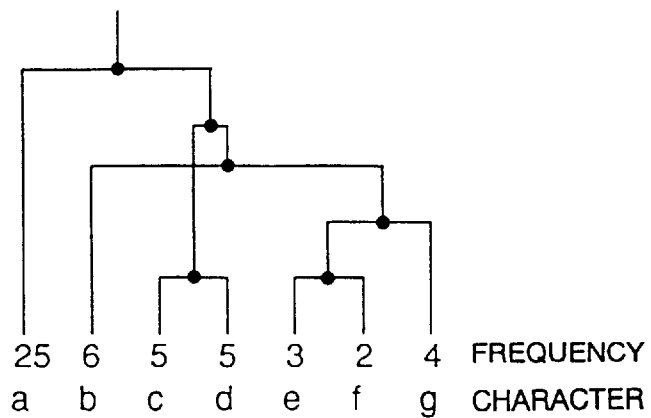
FIG. 19 shows an example of an updated code tree according to the adaptive coding scheme.
FIG. 20 shows a relationship between characters and codewords according to the code tree of FIG. 20.
Figure 21:
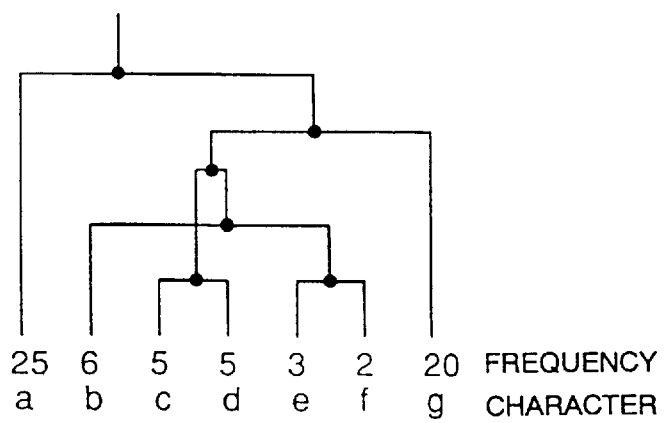
FIG. 21 shows another example of an updated code tree according to the adaptive coding scheme.
Figures 22, 23:
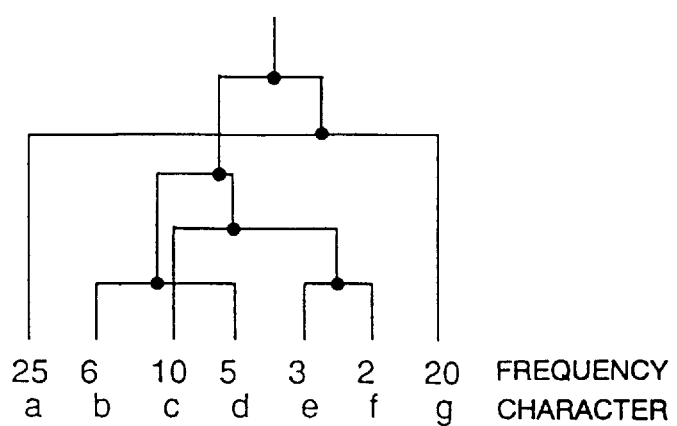
FIG. 22 shows a relationship between characters and codewords according to the code tree of FIG. 22.
FIG. 23 shows a further example of an updated code tree according to the adaptive coding scheme.
Figures 24, 25:
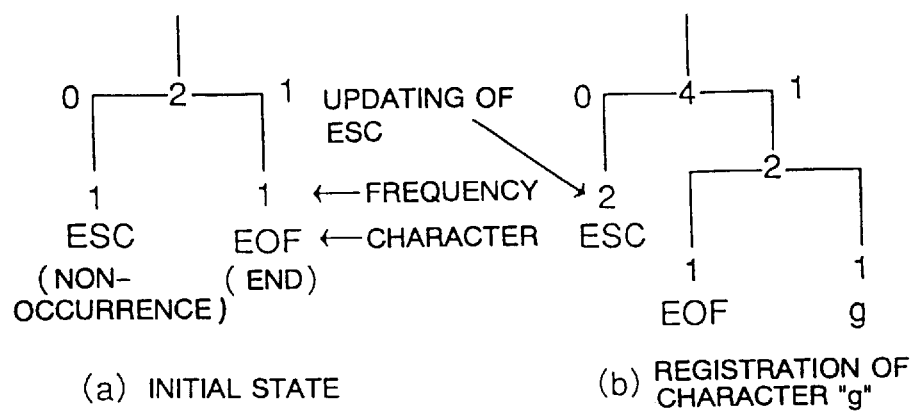
FIG. 24 shows a relationship between characters and codewords according to the code tree of FIG. 24.
FIG. 25 shows an example of a procedure of registering a new symbol in the adaptive coding scheme.

Next, the processing of the data decompression apparatus will be described with reference to FIG. 12.

When a decompression process is started, the consecutive characters judging means 204 judges whether the predetermined number of characters in the context held by the context holding section 201 are identical (S1301). If the judgment result is YES (S1302;YES), the second decoding section decodes a code that is input immediately after the judgment as a run-length with using a run-length table (S1303). Then, the second decoding section consecutively outputs, the number of times equal to the run-length, the character with which the consecutive occurrence has been found (S1304), and updates the run-length table in accordance with the occurrence frequencies of the run-lengths (S1305).

On the other hand, if the judgment result at step S1301 is NO (S1302;YES), the first decoding section outputs a character corresponding to an inputted code in a code tree which is corresponding to the context stored in the context holding section 201 (S1308), and updates the code tree based on the occurrence frequencies of characters after the context (S1309).

After the execution of step S1305 or S1309, if there is no code to be decoded (S1307;NO), the decompression process is finished. If there exists a code (S1307;YES), the flow returns to step S1301 to continue the decompression process.

What is claimed is:

1. A data compression method, comprising:

an obtaining step for obtaining a character one after another from a compression target;

a first coding step for outputting a code corresponding to the character obtained in said obtaining step when the character obtained by said obtaining step and a predetermined number of characters that have been consecutively obtained in the past in said obtaining step are not identical; and a second coding step for counting a number of characters obtained in said obtaining step, while the character obtained in said obtaining step and a predetermined number of characters that have been consecutively obtained in the past in said obtaining step are identical, and outputting a code corresponding to the number of characters counted, when the character obtained in said obtaining step is not identical with the predetermined number of characters.

2. A data decompression method, comprising:

a first decoding step for outputting a character corresponding to a code in a decompression target; and a second decoding step decoding a code following the code used by said first decoding step in the decompression target when a predetermined number of characters that have been consecutively outputted by said first decoding step are identical, and outputting characters identical with the predetermined number of the characters and equal in number to the decoded code produced by the second decoding step.

3. A data compression apparatus, comprising:

obtaining means for obtaining a character one after another from a compression target;

first coding means for outputting a code corresponding to the character obtained by said obtaining means;

first controlling means for instructing said first coding means to stop functioning when the character obtained by said obtaining means and a predetermined number of characters that have recently been used by said first coding means are identical;

judging means, which functions when said first coding means does not function, for judging whether the character obtained by said obtaining means is identical with a continuative character, wherein said continuative character is the last character encoded by said first coding means;

second coding means for outputting a code corresponding to a run-length, which is a number of characters that have been judged to be identical with the continuative character, when said judging means judges that the character is not identical with the continuative character; and second controlling means for instructing said first coding means to start functioning when said second coding means outputs the code.

4. The data compression apparatus according to claim 3, wherein said first coding means comprises:

code table storing means for storing code tables corresponding to character strings, each of the code tables indicates a relationship between codes and characters;

selecting means for selecting a code table corresponding to a character string which is identical with a context that is a character string including characters that have been obtained by said obtaining means among the code table in said code table storing means;

code output means for outputting a code corresponding to the character obtained by said obtaining means by referring to the code table selected by said selecting means; and code table updating means for updating the code table used by said code output means so that a character frequently occurring after the context is related to a code with a shorter length than a character less frequently occurring.

5. The data compression apparatus according to claim 4, wherein said code table storing means stores the code table indicating a relationship which is able to be expressed by a binary tree.

6. The data compression apparatus according to claim 3, wherein said second coding means comprises:

category table storing means for storing a category table which relates codes to a plurality of category data;

counting means for counting a number of characters which are judged to be identical with the continuative character by said judging means;

determining means for determining category data and positional data corresponding to the number counted by said counting means when said judging means judges that the character is not identical with the continuative character;

category data output means for outputting a code corresponding to the category data determined by said determining means using the category table; and positional data output means for outputting a code which expresses the positional data determined by said determining means and has a length corresponding to the category data determined by said determining means.

7. The data compression apparatus according to claim 3, wherein said second coding means determines a code to output in accordance with occurrence frequencies of run-lengths in the past.

8. The data compression apparatus according to claim 3, wherein said second coding means outputs a code corresponding to the run-length using a run-length code table in which codes are related to run-lengths, and updates the run-length code table so that a run-length frequently occurring is related to a code having a shorter length than a run-length less frequently occurring.

9. The data compression apparatus according to claim 3, wherein:

said first controlling means instructs said first coding means to stop functioning when a predetermined number of characters that have consecutively been used by said first coding means are identical with a specific character, and said judging means judges whether the character obtained by said obtaining means is identical with the specific character.

10. A data decompression apparatus, comprising:

first decoding means for outputting a character corresponding to a code in a decompression target;

first controlling means for instructing said first decoding means to stop functioning when a predetermined number of characters that have consecutively been outputted by said first decoding means are identical;

second decoding means, which functions when said first decoding means does not function, for decoding a code following the code used by said first decoding means and outputting characters identical with the predetermined number of the characters and equal in number to the decoded code produced by the second decoding means; and second controlling means for instructing said first decoding means start functioning when said second decoding means outputs the characters.

11. The data decompression apparatus according to claim 10, wherein the first decoding means comprises:

decompression table storing means for storing decompression tables corresponding to character strings, each of the decompression tables indicating a relationship between characters and codes;

character output means for outputting a character corresponding to a code in a decompression target by referring to a decompression table in said decompression table storing means;

specifying means for specifying a decompression table to be used by said character output means on the basis of a context which is a character string including characters that have consecutively been outputted by said character output means; and decompression table updating means for updating the decompression table used by said character output means so that a character frequently occurring after the context is related to a code having a shorter length than a character less frequently occurring.

12. The data decompression apparatus according to claim 11, wherein said decompression table storing means stores the decompression table indicating a relationship which is able to be expressed by a binary tree.

13. The data decompression apparatus according to claim 10, wherein the second decoding means comprises:
   category table storing means for obtaining category data by encoding a code in the decompression target using the category table in said category table storing means;
   positional data specifying means for specifying positional data by obtaining a code having a length corresponding to the category data from the decompression target;
   run-length determining means for determining a run-length on the basis of the category data and the positional data; and
   character output means for outputting characters identical with the continuative character and equal in number to the run-length determined by the run-length determining means.

14. The data decompression apparatus according to claim 10, wherein said second decoding means obtains a run-length by decoding a code in accordance with occurrence frequencies of run-lengths in the past.

15. The data decompression apparatus according to claim 10, wherein said second decoding means decodes a code using a run-length decompression table in which run-lengths are related to codes, and updates the run-length decompression table so that a run-length frequently occurring is related to a code having a shorter length than a run-length less frequently occurring.

16. The data compression apparatus according to claim 10, wherein said first controlling means instructs said first decoding means to stop functioning when a predetermined number of characters that have consecutively been outputted by said first decoding means are identical with a specific character.

17. A data compression apparatus, comprising:
   an obtaining section obtaining a character one after another from a compression target;
   a first coding section outputting a code corresponding to the character obtained in the obtaining section when the character obtained by the obtaining section and a predetermined number of characters that have been consecutively obtained in the past in the obtaining section are not identical; and
   a second coding section for counting a number of characters obtained in the obtaining section, while the character obtained in the obtaining section and a predetermined number of characters that have been consecutively obtained in the past in the obtaining section are identical, and outputting a code corresponding to the number of characters counted, when the character obtained in the obtaining section is not identical with the predetermined number of characters.

* * * * *